United States Patent [19]

Green

[11] Patent Number: 5,065,142
[45] Date of Patent: Nov. 12, 1991

[54] VOLTAGE PICKUP CIRCUIT AND FLASHING DISPLAY FOR HIGH VOLTAGE INDICATOR DEVICE, AND INPUT ELECTRODE THEREFOR

[75] Inventor: Peter J. Green, Huntington, W. Va.

[73] Assignee: Service Machine Company, Huntington, W. Va.

[21] Appl. No.: 527,584

[22] Filed: May 23, 1990

[51] Int. Cl.$^5$ ............................................. G08B 21/00
[52] U.S. Cl. .................................. 340/660; 340/654; 324/133; 324/690; 361/303; 174/73.1
[58] Field of Search ............... 340/654, 660; 324/126, 324/127, 133, 402, 530, 630, 690; 174/73.1; 361/272, 303

[56] References Cited

U.S. PATENT DOCUMENTS

| | | |
|---|---|---|
| 1,913,155 | 6/1933 | Ferguson . |
| 3,039,013 | 6/1962 | Wilmotte . |
| 3,178,697 | 4/1965 | Albright . |
| 3,229,274 | 1/1966 | Riley et al. . |
| 3,328,690 | 6/1967 | Lockie et al. . |
| 3,524,133 | 8/1970 | Arndt . |
| 3,744,045 | 7/1973 | Frink et al. . |
| 3,964,039 | 6/1976 | Craford et al. . |
| 3,970,932 | 7/1976 | Harvey ................ 324/133 |
| 3,991,367 | 11/1976 | Chapman et al. ........... 324/133 |
| 4,152,643 | 5/1979 | Schweitzer, Jr. ............. 340/654 X |
| 4,197,484 | 4/1980 | Tanaka . |
| 4,609,914 | 9/1986 | Fathi ................... 340/660 |
| 4,755,805 | 7/1988 | Chau ................... 340/662 |
| 4,814,933 | 3/1989 | Filter et al. ............... 361/86 |

Primary Examiner—Jin F. Ng
Assistant Examiner—Jeffery A. Hofsass
Attorney, Agent, or Firm—McCaleb, Lucas & Brugman

[57] ABSTRACT

Safety apparatus for indicating a live alternating current voltage condition in an insulated electrical conductor having a central conductor wire comprises: an electrically conductive external sheath extending along a predetermined length of the insulation forming with the central conductor wire a capacitive alternating current path across the insulation; and a signal generating circuit including a full-wave rectifier connected directly between the sheath and ground. A capacitor and a neon or other gas discharge bulb characterized by avalanche breakdown at a predetermined voltage are connected in parallel with the rectifier. Optionally, a piezo electric or other sound-generating device may be in series with the neon bulb. When the central conductor wire is energized at 1000 volts AC or above, the bulb flashes, and the optional sound generator activates, at a frequency dependent on the length of the external sheath along the insulation. The external sheath functions as an outer plate for the capacitance across the insulation, and is a separate electrode slidably engageable with the outer surface of the insulation. The electrode comprises an inner, tubular, metallic element engageable with the insulation, with bell-shaped ends, and an outer tubular shell of insulating material.

7 Claims, 1 Drawing Sheet

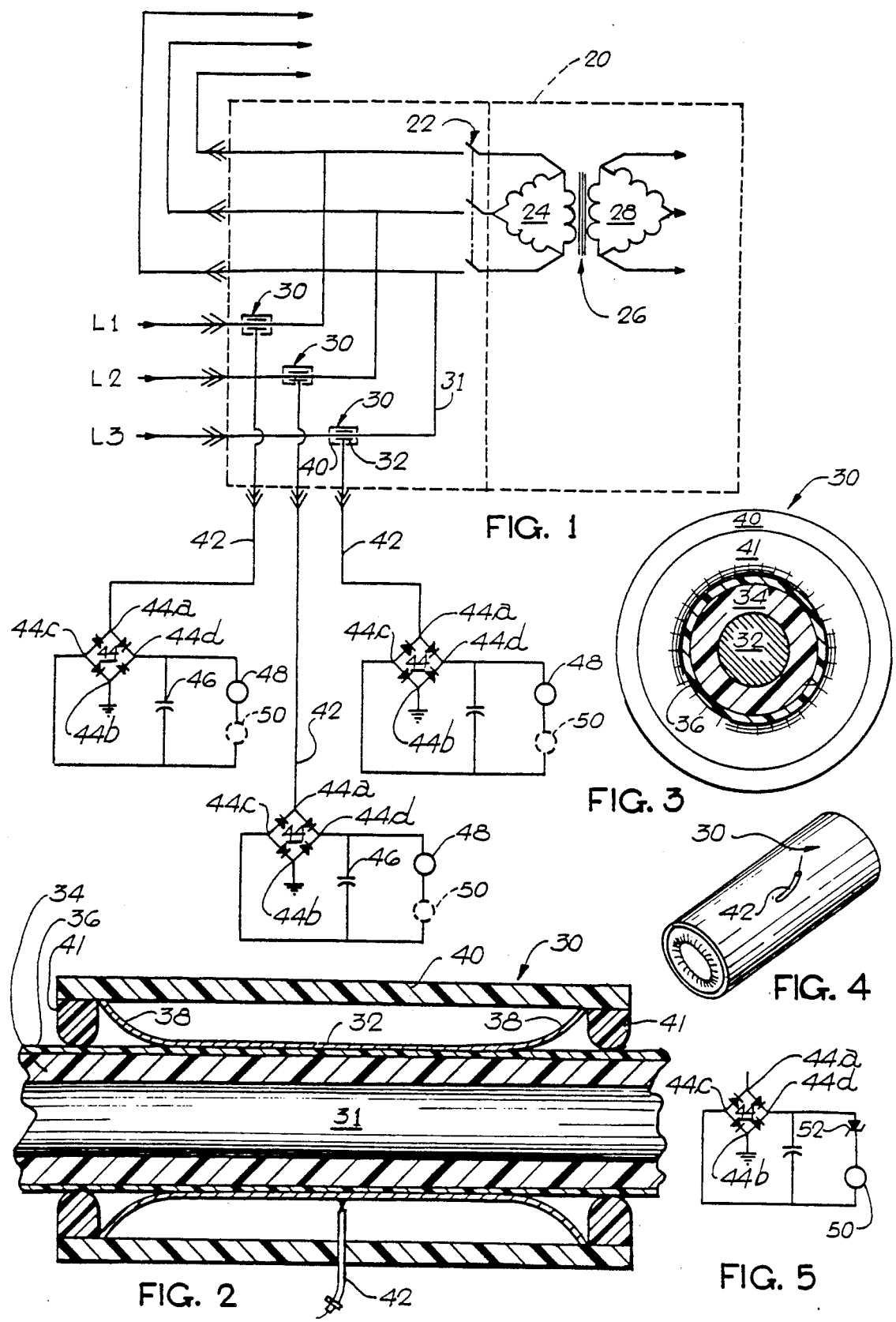

VOLTAGE PICKUP CIRCUIT AND FLASHING DISPLAY FOR HIGH VOLTAGE INDICATOR DEVICE, AND INPUT ELECTRODE THEREFOR

CROSS REFERENCE TO RELATED APPLICATION

An application entitled "HIGH VOLTAGE INDICATOR DEVICE" was filed May 23, 1990 by Donald Neuhouser under Ser. No. 528,734, and was assigned to the assignee of this application.

BACKGROUND OF THE INVENTION

The use of high voltage alternating current power distribution systems is accompanied by the risk that electrical maintenance personnel (and others) may inadvertently come into contact with energized conductors and be electrocuted or seriously injured.

In underground coal mines in the U.S., the high voltage electrical distribution systems are radial in design and they are operated at voltages typically in the range of 4,160 to 15,000 V a.c. In some special applications, distribution voltages may be lower and higher than that range. Power centers with transformers therein are located in active areas of the mine to transform the distribution voltage to suitable lower utilization voltages.

Because of the radial design of the underground high voltage distribution system, the high voltage sides of the power centers are typically of "feed-through" design. This means that the incoming high voltage supply cable is connected into the power center and loops directly out again to supply other power centers farther into the mine. An isolation switch on the primary side of each power center transformer can isolate the transformer from the high voltage supply, but the incoming and outgoing high voltage cables remain energized.

When the isolation switch on the primary side of any power center is closed to energize the transformer, it is immediately evident to anyone in the vicinity that the equipment is energized. The transformer produces the distinctly audible "mains hum" associated with the magnetizing of the core steel and also various indicator lights associated with the low voltage output circuits are illuminated.

In contrast, when the isolation switch is in the "open" position, there is no sound from the equipment, there are no indicator lights illuminated, and usually there is no voltmeter to indicate whether or not the incoming distribution voltage is available. In fact it is impossible to determine by visual or audeal inspection whether the incoming supply is on or off. This has been a contributory factor in numerous accidents.

SUMMARY OF THE INVENTION

The present invention provides a simple, cost effective and reliable means of indicating that the incoming high voltage supply to a power center, switchhouse or similar piece of equipment is switched on.

The high voltage circuits in a mine power center or switchhouse are connected by means of individual insulated conductors which are unshielded by any surrounding conductive layer. Consequently the electric field associated with high voltage energization of the conductor extends beyond the cable itself to other phase conductors and surrounding grounded surfaces within the power center enclosure. The invention makes use of these stray electric fields to provide an indication that the high voltage conductors are energized. In effect, a capacitor is constructed around the insulated conductor and this provides a high impedance circuit through a gas discharge lamp to ground. The current through the capacitor is sufficient to cause the discharge tube to glow when the high voltage circuit is energized, thus providing a visible warning to maintenance personnel.

The high voltage capacitor is constructed so the high voltage central conductor wire within the insulation forms an inner electrode or plate of the capacitor and a short axial length of the conductor insulation forms the principal dielectric of the capacitor.

It is another object of the present invention that the other, outer capacitor electrode or plate may be an off-the-shelf commercial item available from electrical distributors or from a manufacturer, formed as a sheath which is slidably assembleable along each of the electrical distribution conductors comprising the three phase circuit in a power center or switchhouse in, for example, an underground coal mine.

Typically, capacitors formed across the conductor insulation in accordance with the present invention would be applied to each phase of a three phase circuit in a power center or switchhouse. In the simplest arrangement the three lead wires from the three sheaths constituting the outer capacitor electrodes or plates are respectively connected to first input terminals of three full-wave rectifiers. The corresponding second input terminals of the rectifiers are preferably connected directly to ground, for best operation.

Avalanche-discharge devices such as neon bulbs, lamps controlled by avalanche diodes which discharge at predetermined voltages, or miniature fluorescent tubes, are connected in parallel with the output terminals of each of the full-wave rectifiers mentioned above to provide visible signals that the respective conductors are energized. Optionally, an audible alarm such as a piezo electric device is also connected to indicate energization of the conductor, with or without a visible indication.

The present invention is not intended to determine or display a particular voltage level, but only to indicate whether a high voltage of dangerous magnitude exists.

The arrangement described has the following specific advantages over alternative means of achieving the same end using conventional components.

1) The invention does not involve any direct connection to the high voltage circuit.
2) No transformer(s) is(are) required.
3) No fuses are required.
4) Each of the three phases is independently monitored, providing desirable redundancy.
5) The number of components is low.
6) Component reliability is high.
7) Overall reliability is high.
8) The components required can readily be retrofitted to existing power centers, by sliding the special outer electrode sheaths onto the distribution power conductors.

The impedance of the capacitors across the conductor insulation is very high at 60 $H_z$ power frequencies and consequently the currents available are at at microampere levels.

However, at voltages of 1000 volts and above, at 60 $H_z$, the current is sufficient to provide adequate illumination in standard neon bulbs and similar gas discharge tubes.

BRIEF DESCRIPTION OF THE DRAWINGS

Other objects and advantages will be apparent from the following description in connection with the drawings in which:

FIG. 1 is a schematic diagram showing a preferred form of the invention applied to each phase of a three phase distribution circuit supplying high voltage power to a power center in an underground coal mine for example;

FIG. 2 is an enlarged longitudinal cross-section of one of three external capacitive electrodes or plates shown in FIG. 1;

FIG. 3 is an end view of FIG. 2;

FIG. 4 is a perspective view of one of the capacitive electrodes or plates shown in the previous figures; and FIG. 5 is another embodiment of the invention.

Like parts are designated by like reference characters throughout the drawings.

DESCRIPTION OF THE PREFERRED EMBODIMENT

Referring now more particularly to the drawings, a power center such as used in underground coal mines is indicated by the numeral 20. Typically, three phase power at 7000-15,000 volts and 60 Hz enters the power center enclosure 20 and loops directly out again to supply other power centers farther into the mine.

A three phase isolation switch 22 supplies the primary 24 of a three phase transformer 26. Secondary 28 reduces the high distribution voltage to suitable lower utilization voltages.

Three outer capacitor electrodes 30 are provided, one for each of the power distribution conductors L1, L2 and L3. Each power distribution conductor comprises a central conductive wire 31, annular cross-section insulation 34 with an external protective jacket 36 which may be a tough, abrasion-resistant cover. Typically, the portions of the power distribution conductors inside the power center enclosure 20 will not have an electrically conductive sheath outside the jacket 36.

The outer capacitor electrodes or plates 30 may be identical. The outer capacitor electrode for power conductor L1 is shown in FIG. 2, it being understood that the corresponding electrodes 30 for power conductors L2 and L3 may be the same.

Referring to FIG. 2, each outer capacitive electrode or plate 30 comprises an inner tubular sheath portion 32 of electrically conductive metal such as copper or aluminum which is slidably engageable with the outer surface of the insulation jacket 36. Opposite bell-mouthed end portions 38,38 protect the insulation from corona discharge damage due to electrical stress concentration. Each electrode 30 has an external tubular sleeve or shell 40 of insulating material completely surrounding and protecting the inner, conductive tube 32. The tubular shell 40 has inwardly extending flange end portions 41 engageable with opposite respective bell-mouthed end portions 38 of the metallic tube 32 to hold the latter stably against endwise movement therein.

An external wire lead 42 is connected to the inner conductive sheath portion 32, as by soldering or brazing, and extends to the outside through tubular insulating shell 40. Each wire lead 42 is connected to a corresponding full wave rectifier or diode bridge 44.

An important part of the invention which contributes to exceptionally efficient operation is the fact that each of the full wave rectifiers 44 is connected directly between the electrode sheath 32 and ground as shown in FIGS. 1 and 2. First and second input terminals 44a and 44b are directly connected respectively to the corresponding sheath 32 and to ground.

In the circuit shown, the alternating current picked up by the electrode 30 of the high voltage capacitor across insulation 34 is fully rectified by the respective diode bridge 44, the charge being stored in a corresponding capacitor 46 which is connected across rectifier output terminals 44c and 44d.

A neon discharge bulb 48 is also connected across the corresponding rectifier output terminals 44c and 44d, in parallel with the corresponding capacitor 46. The neon discharge bulb 48 will not conduct until the voltage across the bulb reaches approximately 80 volts, when an avalanche discharge occurs and the capacitor discharges instantly, creating a bright flash of light. The flashing continues at a frequency determined by the voltage, length of each electrode, and other parameters as long as the high voltage central conductor wire 31 is energized.

The rate of flashing is determined, among other factors, by the phase to ground voltage of the supply, by the capacitance of the storage capacitor 46, and by the length of the sheath 32 along the power conductor L1, L2 or L3.

The flashing frequency also varies with the voltage in conductor 31. In one specific system where the invention was tested, at 1000 volts in conductor wire 31, the neon bulb 48 in each phase flashed at about every two seconds; that is, three flashes were spread out over two seconds. As the voltage increases, flashing frequency eventually increases to the point where the effect on an operator's eye is one long continuous flash. Preferably the frequency should be at a rate low enough for the operator's eye to sense that such bulb flashes on and off.

One very effective way of reducing the flash frequency to a desired perceptible rate is to reduce the length of the sheath 32 along the insulation 34, for higher nominal working voltages of the central power conductor wire 31.

As described and shown, three neon bulbs 48 would be used per installation, one for each conductor L1, L2 and L3. This has the following benefits:

1. It checks all three phases.
2. It provides protective redundancy for maximum safety. In case a circuit associated with one of the neon bulbs is defective, there are two other circuits for back-up.
3. Where the distribution power voltage is even less than 1000 volts, say, where the frequency in one bulb might be only once every six seconds, the cluster of three bulbs would provide an average flash at least every two seconds.

Another option is to include a sound-generating piezo electric device 50 in series with the neon bulb 48. The sound generator produces a sharp "chirp" each time the bulb flashes. This option provides both visible and audible signals.

A still further modification, where only an audible signal would be required, is shown in FIG. 5. There, an avalanche diode 52, or any other suitable device for conducting electrical current in an avalanche mode in response to a predetermined voltage, is substituted for the neon bulb 48, in series with the piezo electric sound generator 50.

While a particular example of the present invention has been shown and described, changes and modifications may be made without departing from the invention in its broadest aspects. The aim of the appended claims, therefore, is to cover all such changes and modification included within the spirit and scope of the invention.

The embodiments of the invention in which an exclusive property or privilege is claimed are defined as follows:

1. An electrode comprising:
   an electrically conductive tube slidably engageable with the outer surface of the insulation on an insulated conductor, opposite end portions of the tube being outwardly flared with bell-shaped ends to reduce electrical stress concentration in any electrical insulation positioned within the electrode;
   a tubular shell of insulating material completely surrounding and covering the electrically conductive tube; and
   said tubular shell having inwardly extending flange end portions engageable with opposite respective ends of the electrically conductive tube to hold the tube stably therewithin.

2. An electrode according to claim 1 in which the tubular shell of insulating material has an inwardly-turned, centrally-apertured flange at each end engageable with the corresponding bell-shaped end of the electrically conductive tube to lock the electrically conductive tube against endwise movement within the tubular shell.

3. An electrode according to claim 2 in which an insulated connecting wire extends through the tubular shell of insulating material and is connected to the electrically conductive tube within the tubular shell.

4. Apparatus for indicating a live voltage condition in an electrical conductor consisting of a central conductor wire with insulation thereon, said apparatus comprising:
   an electrically conductive external sheath comprising a tubular electrically conductive electrode slidably assembleable onto the outside surface of a predetermined length of the insulation forming with said central conductor wire a capacitive alternating current path across the insulation;
   said tubular electrically conductive electrode having outwardly flared bell-shaped opposite end portions to reduce electrical stress concentrations in the insulation; and
   a signal generating circuit including rectifier means connected directly between said sheath and ground, capacitor means connected in parallel with said rectifier means, said rectifier means being effective to apply a predetermined charge to the capacitor means in response to an alternating current live voltage condition in said central conductor wire, signal means cyclically energizable to produce a signal in response to repeated accumulation of said predetermined charge in the capacitor means, said signal means being cyclically energizable at a frequency dependent on said predetermined length of the external sheath along the insulation.

5. Apparatus for indicating a live voltage condition in an electrical conductor according to claim 4 in which a tubular sleeve of electrical insulating material completely surrounds and covers the tubular electrically conductive electrode.

6. An electrode for indicating a live voltage condition in an electrical conductor consisting of a central conductor wire with insulation thereon, said electrode comprising:
   an electrically conductive tube assembleable onto the outside surface of the insulation forming with said central conductor wire a capacitive alternating current path across the insulation;
   said electrically conductive tube having outwardly flared bell-shaped opposite end portions to reduce electrical stress concentrations in the insulation.

7. An electrode according to claim 6 having a tubular shell of insulating material completely surrounding and covering the electrically conductive tube, said tubular shell having inwardly extending flange end portions engageable with opposite respective ends of the electrically conductive tube to hold the tube stably therewithin.

* * * * *